US006992389B2

(12) United States Patent
Andricacos et al.

(10) Patent No.: US 6,992,389 B2
(45) Date of Patent: Jan. 31, 2006

(54) BARRIER FOR INTERCONNECT AND METHOD

(75) Inventors: Panayotis C. Andricacos, Croton-on-Hudson, NY (US); Tien-Jen J. Cheng, Bedford, NY (US); Emanuel I. Cooper, Scarsdale, NY (US); David E. Eichstadt, Park Ridge, IL (US); Jonathan H. Griffith, Lagrangeville, NY (US); Randolph F. Knarr, Goldens Bridge, NY (US); Roger A. Quon, Rhinebeck, NY (US); Erik J. Roggeman, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 122 days.

(21) Appl. No.: 10/709,321

(22) Filed: Apr. 28, 2004

(65) Prior Publication Data

US 2005/0245070 A1    Nov. 3, 2005

(51) Int. Cl.
*H01L 23/48*     (2006.01)
*H01L 23/52*     (2006.01)
*H01L 21/60*     (2006.01)
*H01L 23/485*    (2006.01)

(52) U.S. Cl. .................. 257/746; 257/751; 257/753; 257/766; 257/767; 257/762; 257/E23.021; 257/E21.508; 257/E21.586

(58) Field of Classification Search ............. 257/746, 257/751, 753, 766, 767, E21.508, E21.175, 257/E23.021
See application file for complete search history.

(56) References Cited

U.S. PATENT DOCUMENTS

| | | | | |
|---|---|---|---|---|
| 3,480,522 A | * | 11/1969 | Brownlow | 205/176 |
| 3,489,657 A | * | 1/1970 | Hoskinson et al. | 205/176 |
| 3,833,481 A | * | 9/1974 | Olson et al. | 205/102 |
| 4,751,110 A | * | 6/1988 | Gulla et al. | 427/305 |
| 5,847,327 A | * | 12/1998 | Fischer et al. | 174/258 |
| 6,113,758 A | * | 9/2000 | de Nora et al. | 204/284 |
| 6,458,694 B2 | * | 10/2002 | Ogure et al. | 438/652 |
| 6,547,946 B2 | * | 4/2003 | Meltzer et al. | 205/181 |
| 6,716,738 B2 | * | 4/2004 | Kim et al. | 438/612 |

OTHER PUBLICATIONS

Zhang et al., "tribological properties of nickel-copper multilayer film on beryllium bronze substrate", Thin Solid Films vol. 305, 1997, pp. 292-296.*

"Microstructure/Mechanical Properties Relationship in Electrodeposited Ni/Cu Nanolaminates," F. Ebrahimi et al., Materials Science and Engineering A301 (2001) pp. 23-34.

* cited by examiner

*Primary Examiner*—Michael Lebentritt
*Assistant Examiner*—Ron Pompey
(74) *Attorney, Agent, or Firm*—Lisa U. Jaklitsch; Hoffman, Warnick & D'Alessandro LLC

(57) ABSTRACT

A method of creating a multi-layered barrier for use in an interconnect, a barrier for an interconnect, and an interconnect including the barrier are disclosed. The method includes creating the multi-layered barrier in a recess of the device terminal by use of a single electroplating chemistry to enhance protection against voiding and de-lamination due to the diffusion of copper, whether by self-diffusion or electromigration. The barrier includes at least a first layer of nickel-rich material and a second layer of copper-rich material. The barrier enables use of higher current densities for advanced complementary metal-oxide semiconductors (CMOS) designs, and extends the reliability of current CMOS designs regardless of solder selection. Moreover, this technology is easily adapted to current methods of fabricating electroplated interconnects such as C4s.

10 Claims, 3 Drawing Sheets

US 6,992,389 B2

BARRIER FOR INTERCONNECT AND METHOD

BACKGROUND OF INVENTION

The present invention relates generally to interconnects, and more particularly to a barrier for an interconnect and method of forming same.

Reduction of device dimensions and increased clock speeds strain the limits of conventional interconnect technology. For example, higher current densities required for next generation technologies present a number of problems. One problem is that increased current densities increase the likelihood of voiding and de-lamination in under bump metallurgy (BLM) structure of a device terminal. In particular, the increased current densities increase thermal diffusion and electro-migration of copper from the BLM structure to the solder joint. This failure mode is especially possible for systems employing solders with high concentrations of tin (Sn) such as the leading lead-free solders or the eutectic lead-tin (PbSn) solders.

In one approach, a nickel-only barrier was attempted. However, the presence of nickel alone was found insufficient to prevent voiding and de-lamination of titanium-tungsten (TiW), chromium-copper (CrCu) or copper (Cu) of the BLM structure, especially when the device was joined to a substrate using a nickel-gold (Ni—Au) pad. The copper is likely to diffuse through the nickel to react with tin in a high temperature storage test. Therefore, a layer of copper on top of nickel is proposed to counter balance the chemical potential for copper diffusion. Unfortunately, this requires two plating baths to deposit both nickel and copper layers.

As outlined in Ebrahimi et al., "Microstructure/mechanical properties relationship in electrodeposited Ni/Cu nanolaminates," Materials Science and Engineering, May 2000, nickel and copper can be plated from one plating bath. In that approach, laminated nickel-copper (Ni—Cu) structures using a single sulfamate solution are provided. While the use of a single bath is advantageous, that approach, designed on generating pure nickel and pure copper layers, does not take into consideration difficulties of plating the structure in the recess of a photoresist patterned wafer.

In view of the foregoing, there is a need in the art for a barrier for an interconnect and method of forming the same that do not suffer from the problems of the related art.

SUMMARY OF INVENTION

The invention includes a method of creating a multi-layered barrier for use in an interconnect, a barrier for an interconnect, and an interconnect including the barrier. The method includes creating the multi-layered barrier in a recess of a device terminal by use of a single electro-plating chemistry to enhance protection against voiding and de-lamination due to the diffusion of copper from the device terminal to the solder joint, whether by self-diffusion or electro-migration. The barrier includes at least a first layer of nickel-rich material and a second layer of copper-rich material. The barrier enables use of higher current densities for advanced complementary metal-oxide semiconductors (CMOS) designs, and extends the reliability of current CMOS designs regardless of solder selection. Moreover, this technology is easily adapted to current methods of fabricating electroplated interconnects such as controlled collapse chip connectors (C4) or ball grid array connectors.

A first aspect of the invention is directed to a barrier for use in an interconnect, the barrier comprising: a nickel-rich nickel-copper (NiCu) layer electrically connected to a device terminal of the interconnect, the device terminal including a recess for receiving the nickel-rich nickel-copper layer, the nickel-rich layer including a higher percentage of nickel than copper; and a copper-rich nickel-copper (NiCu) layer electrically connected to the nickel-rich NiCu layer and a solder joint of the interconnect, the copper-rich NiCu layer including a higher percentage of copper than nickel.

A second aspect of the invention provides an interconnect comprising: a device terminal, including a recess in a surface thereof, for electrically connecting to a semiconductor device; a solder joint electrically connecting the device terminal to another structure; and a barrier between the device terminal and the solder joint, the barrier including: a nickel-rich nickel-copper (NiCu) layer electrically connected to the recess of the device terminal, the nickel-rich NiCu layer including a higher percentage of nickel than copper, and a copper-rich nickel-copper (NiCu) layer electrically connecting the nickel-rich NiCu layer and a solder joint of the interconnect, the copper-rich NiCu layer including a higher percentage of copper than nickel.

A third aspect of the invention is directed to a method of forming a barrier for an interconnect, the method comprising the steps of: bathing the device terminal in a single nickel-copper binary bath; forming a nickel-rich nickel-copper (NiCu) layer on a device terminal of the interconnect including in a recess of the device terminal while providing no agitation to the bath, the nickel-rich NiCu layer including a higher percentage of nickel than copper; and forming a copper-rich nickel-copper (NiCu) layer on the nickel-rich NiCu layer while providing agitation to the bath, the copper-rich NiCu layer including a higher percentage of copper than nickel.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
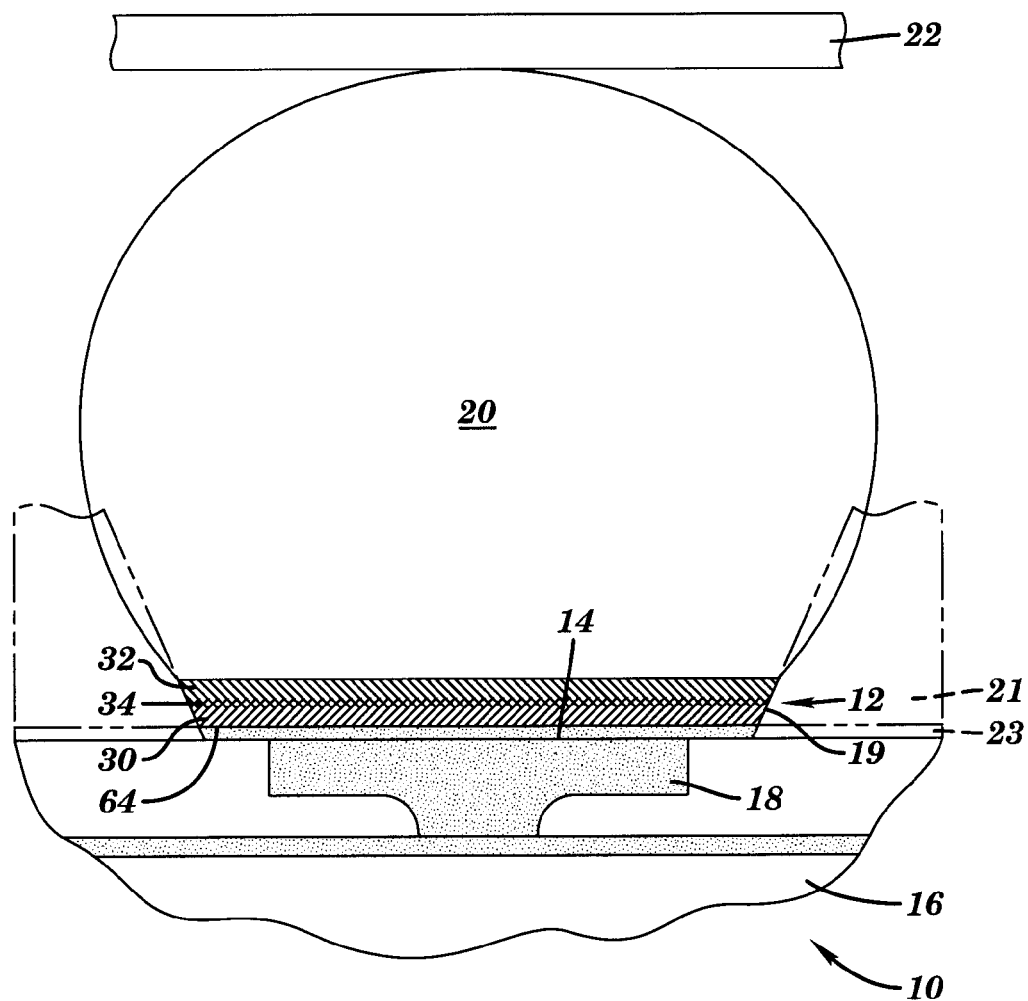
FIG. 1 shows an interconnect including an electro-migration barrier according to the invention.

With reference to the accompanying drawings, FIG. 1 illustrates an interconnect 10 having a barrier 12 for preventing voiding and de-lamination in a device terminal 14 including an under bump metallurgy (UBM) seed layer 23 due to thermal diffusion and electro-migration of copper. In accordance with the invention, interconnect 10 includes device terminal 14 electrically connected to a semiconductor device 16, i.e., a via or contact 18 of semiconductor device 16. Device terminal 14 is formed in a patterned recess or hole 19 of a photoresist mask 21 (shown in phantom in FIG. 1). It should be recognized, however, that photoresist is an illustrative material, i.e., recess 19 may be provided in other material. All of photoresist mask 21 and UBM seed layer 23 outside of barrier 12 do not constitute part of the final device, but are shown in FIG. 1 in phantom for brevity. In one embodiment, recess 19 preferably has an aspect ratio, i.e., depth to width between 0.5 to 2.

In one embodiment, device terminal 14 includes titanium-tungsten (TiW), chromium-copper (CrCu) or copper (Cu). However, device terminal 14 may include any other metal, metal stack, or alloy containing copper now known or later developed for electrical connection to semiconductor device 16. Interconnect 10 also includes a solder joint 20 for electrically connecting device terminal 14 to another structure 22, and a UBM seed layer 23 such as TiW/CrCu/Cu, Ta/TaN/Cu, Al/NiV/Cu, Ti/Cu and other seed metallurgies terminating with copper. Structure 22 may include, for example, nickel (Ni), copper (Cu) or gold (Au). Solder joint 20 may include any now known or later developed solder material such as tin (Sn) and eutectic lead-tin (PbSn).

Turning to the details of barrier 12, the barrier is positioned between device terminal 14 including UBM seed layer 23 and solderjoint 20. Barrier 12 includes a nickel-rich nickel-copper (NiCu) layer 30 in direct contact with device terminal 14, i.e., UBM seed layer 23, and a copper-rich nickel-copper (NiCu) layer 32 in direct contact with nickel-rich layer 30 and solderjoint 20. Nickel-rich NiCu layer 30 includes a higher percentage of nickel (Ni) than copper (Cu), and Cu—Ni layer 32 includes a higher percentage of copper (Cu) than nickel (Ni). In one embodiment, nickel-rich NiCu layer 30 includes greater than approximately 90% nickel on average, and Cu—Ni layer 32 includes greater than approximately 90% copper on average. Barrier 12 may also include an intermediate alloy layer 34 between nickel-rich NiCu layer 30 and copper-rich NiCu layer 32. Layer 34 includes a higher percentage of copper (Cu) than nickel-rich layer 30 and a higher percentage of nickel than copper-rich layer 32. It should be recognized, however, that layer 34 may be omitted depending on the methodology used, as described below.

Figure 2A:
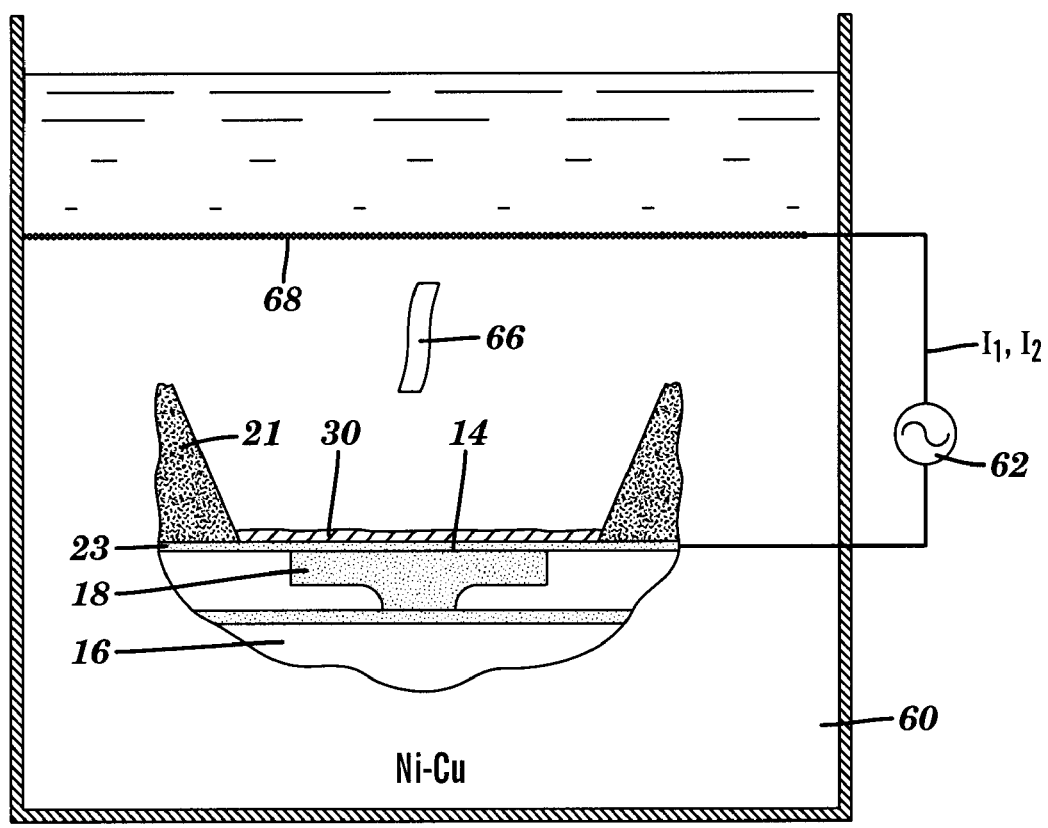
FIGS. 2A–2B show a method of forming the barrier of FIG. 1.
Figure 2B:
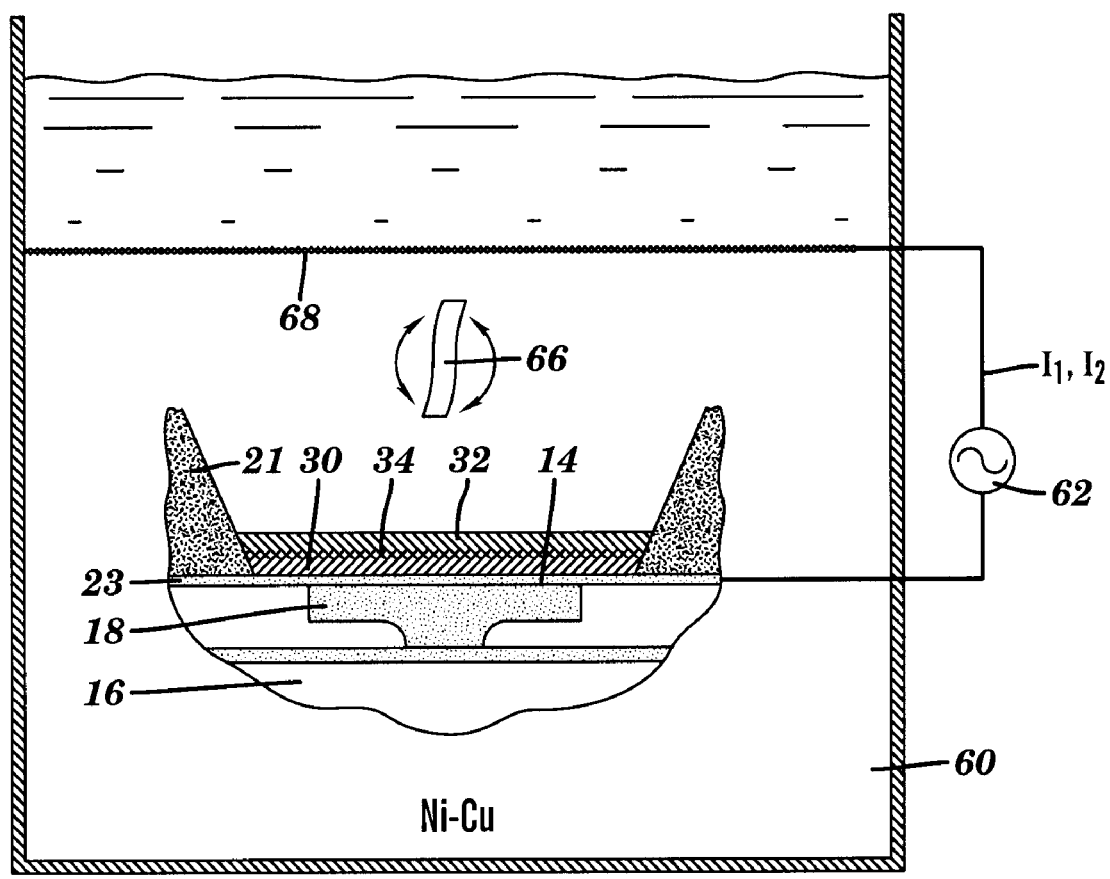

Turning to FIGS. 2A–2B, a method of forming barrier 12 will now be described. As shown, the method includes bathing device terminal 14 in a nickel-copper binary bath 60 with photoresist mask 21 providing an opening to device terminal 14. Next, nickel-rich NiCu layer 30 is formed without agitating bath 60, and subsequently, Cu—Ni layer 32 is formed with strong agitation in bath 60. Layer 34 is formed during a transition of forming of layer 30 and layer 32. It should be recognized that while device terminal 14 is shown immersed in nickel-copper binary bath 60, other configurations may be possible. For example, device terminal 14 may be suspended in bath 60. Bath 60 utilizes a power source 62 including an insoluble anode 68 (device terminal 16 provides cathode). Bath 60 also includes an agitator 66, which may be any now known or later developed agitating device.

Referring to FIG. 2A, in one embodiment, the first forming step includes applying a first current (I1) (via power source 62 and anode 68) to device terminal 14 to attract almost entirely nickel to device terminal 14 to form nickel-rich layer 30 (FIG. 1) in recess 19. As noted above, nickel-rich NiCu layer 30 includes a higher percentage of nickel than copper. During this step, agitator 66 is deactivated. The provision of no agitation limits co-deposition of copper, and thus allows for a high purity nickel (Ni) layer that is, on average, greater than approximately 90% in layer 30. Accordingly, nickel-rich layer 30 presents a high quality film with randomized grain structure.

The second forming step includes applying a second current (I2) to device terminal 14 to attract mostly copper to device terminal 14 to form copper-rich NiCu layer 32 (FIG. 1) while agitating the bath with agitator 66. Agitation of bath 60 during formation of copper-rich layer 32 allows for better deposition of copper. Copper-rich NiCu layer 32 includes a higher percentage of copper than nickel, i.e., greater than approximately 90% copper, on average. First current (I1) is higher than second current (I2). For example, first current (I1) may be approximately 10 to 50 mA/cm2 and second current (I2) may be approximately 0.5 to 5 mA/cm2.

As the second forming step begins, a transition stage exists in which layer 34 may be formed. The makeup (or existence) of layer 34 can be controlled by changing: the currents applied (I1, I2), the agitation and the position of agitator 66 relative to device terminal 14. For example, changing from first current (I1) to second current (I2) may occur over a period of time or instantaneously, so as to control the deposition transition from mostly nickel to mostly copper. Similarly, the addition of agitation may occur over a period of time or instantaneously so as to control the ability to deposit mostly copper. Layer 34 includes a mixture of nickel and copper formed between nickel-rich NiCu layer 30 and copper-rich NiCu layer 32 when the transition occurs. Layer 34, as noted above, includes a higher percentage of copper than nickel-rich layer layer 30 and a higher percentage of nickel than copper-rich layer layer 32.

Barrier 12 interlocks solderjoint 20 to device terminal 14 by forming inter-metallic compounds including nickel, and the layering of copper atop nickel. Where UBM seed layer 23 includes copper, the copper in barrier 12 substantially reduces diffusion of copper from seed layer 23 into solder joint 20 by removing a concentration gradient. As a result, barrier 12 also reduces de-lamination of seed layer 23 from solder joint 20. Barrier 12 thus enables the use of higher current densities for interconnect applications employing tin-based solders. The invention also minimizes manufacturing complexity because barrier 12, including two layers 30, 32, is created using one electro-plating bath.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims. For example, while the barrier has been described for use with an interconnect, it should be recognized that the barrier may also find use in other applications such as creation of masks for package substrates.

What is claimed is:

1. A barrier for use in an interconnect, the barrier comprising:
   a nickel-rich nickel-copper (NiCu) layer electrically connected to a device terminal of the interconnect, the device terminal including a recess for receiving the nickel-rich nickel-copper layer, the nickel-rich layer including a higher percentage of nickel than copper; and
   a copper-rich nickel-copper (NiCu) layer electrically connected to the nickel-rich NiCu layer and a solder joint of the interconnect, the copper-rich NiCu layer including a higher percentage of copper than nickel
   further comprising an intermediate alloy layer between the nickel-rich NiCu layer and the copper-rich NiCu layer;
   wherein the intermediate alloy layer includes a higher percentage of copper than the nickel-rich NiCu layer and a higher percentage of nickel than copper-rich NiCu layer.

2. The barrier of claim 1, wherein the nickel-rich NiCu layer includes greater than approximately 90% nickel, and the copper-rich NiCu layer includes greater than approximately 90% nickel.

3. The barrier of claim 1, wherein the solder joint includes one of: tin (Sn) and eutectic lead-tin (PbSn).

4. The barrier of claim 1, wherein the device terminal includes one of: titanium-tungsten (TiW), chromium-copper (CrCu) and copper (Cu).

5. The barrier of claim 1, wherein the recess has an aspect ratio no less than 0.5 and no greater than 2.

6. An interconnect comprising:
   a device terminal, including a recess in a surface thereof, for electrically connecting to a semiconductor device;
   a solder joint electrically connecting the device terminal to another structure; and
   a barrier between the device terminal and the solder joint, the barrier including:
   a nickel-rich nickel-copper (NiCu) layer electrically connected to the recess of the device terminal, the nickel-rich NiCu layer including a higher percentage of nickel than copper, and
   a copper-rich nickel-copper (NiCu) layer electrically connecting the nickel-rich NiCu layer and a solder joint of the interconnect, the copper-rich NiCu layer including a higher percentage of copper than nickel
   further comprising an intermediate alloy layer between the nickel-rich NiCu layer and the copper-rich NiCu layer;
   wherein the intermediate alloy layer includes a higher percentage of copper than the nickel-rich NiCu layer and a higher percentage of nickel than copper-rich NiCu layer.

7. The interconnect of claim 6, wherein the nickel-rich NiCu layer includes greater than approximately 90% nickel, and the copper-rich NiCu layer includes greater than approximately 90% copper.

8. The interconnect of claim 6, wherein the solder joint includes one of: tin (Sn) and eutectic lead-tin (PbSn).

9. The interconnect of claim 6, wherein the device terminal includes one of: titanium-tungsten (TiW), chromium-copper (CrCu) and copper (Cu).

10. The interconnect of claim 6, wherein the recess has an aspect ratio of no less than 0.5 and no greater than 2.

* * * * *

UNITED STATES PATENT AND TRADEMARK OFFICE
CERTIFICATE OF CORRECTION

PATENT NO. : 6,992,389 B2 Page 1 of 1
DATED : January 31, 2006
INVENTOR(S) : Adricacos et al.

It is certified that error appears in the above-identified patent and that said Letters Patent is hereby corrected as shown below:

<u>Title page,</u>
Item [75], Inventors, second inventor should read -- Tien-Jen Cheng --.

Signed and Sealed this

Second Day of May, 2006

JON W. DUDAS
*Director of the United States Patent and Trademark Office*